United States Patent [19]
Pegg et al.

[11] Patent Number: 4,521,732
[45] Date of Patent: Jun. 4, 1985

[54] PULSE SEQUENCE FOR USE IN PERFORMING NUCLEAR MAGNETIC RESONANCE SPECTROSCOPY

[76] Inventors: David T. Pegg, 7 Fanfare St., Eight Mile Plain; David M. Doddrell, 30 Belinda Crescent, Springwood; Max R. Bendall, 274 Ford Rd., Burbank, all of Brisbane, Queensland, Australia

[21] Appl. No.: 466,543

[22] Filed: Feb. 15, 1983

Related U.S. Application Data

[63] Continuation-in-part of Ser. No. 358,636, Mar. 16, 1982, abandoned.

[51] Int. Cl.$^3$ ............................................. G01R 33/08
[52] U.S. Cl. ................................... 324/300; 324/308; 324/312
[58] Field of Search ............... 324/307, 308, 309, 311, 324/312, 313, 314

[56] References Cited
U.S. PATENT DOCUMENTS

| | | | |
|---|---|---|---|
| 4,050,009 | 9/1977 | Sagalyn | 324/308 |
| 4,068,161 | 1/1978 | Erust | 324/312 |
| 4,238,735 | 12/1980 | Muller | 324/314 |
| 4,345,207 | 8/1982 | Bertrand | 324/314 |

Primary Examiner—Michael J. Tokar
Attorney, Agent, or Firm—Frank H. Foster

[57] ABSTRACT

A liquid sample comprising a system made up of two types of heteronuclei is pulsed in a particular manner in a nuclear magnetic resonance (NMR) experiment so that the resulting NMR signal from the one type of heteronucleus depends on the scalar-coupled interaction with the other type of heteronucleus. The sequence of radiofrequency pulses is such that the two types of heteronuclei interact via the phenomenon of polarization transfer and by the phenomenon of the correlated motion of the two types of heteronuclei in the transverse plane of the doubly rotating reference frame. The combination of these two phenomena in the one pulse sequence provides NMR signals which are easily made less dependent on the exact magnitude of the heteronuclear scalar coupling constant. The coupled NMR signals for polarization transfer from a system of multiple spin-half nuclei have multiplet components in the normal ratio. Consequently the pulse sequence provides an improved method for obtaining chemical structural information. Applications include the provision of accurate edited subspectra; polarization transfer between any number of one type of heteronucleus of any spin number and any number of a second type of heteronucleus of any spin number; and two-dimensional NMR spectroscopy.

21 Claims, 14 Drawing Figures

PULSE SEQUENCE FOR USE IN PERFORMING NUCLEAR MAGNETIC RESONANCE SPECTROSCOPY

This application is a continuation in part of our earlier filed application Ser. No. 358,636 filed Mar. 16, 1982 and now abandoned.

BACKGROUND OF THE INVENTION

The invention concerns a new sequence of radiofrequency pulses which may be applied to a system of two heteronuclear spins in an NMR (nuclear magnetic resonance) experiment in order to determine chemical structural information. The resulting NMR spectra provide information about the chemical environment of the two nuclear spins and thus information about the structure of the chemical compounds in which the two nuclear spins are found.

The terminology used in this disclosure is commonly used in the NMR literature. However, examples of the terminology may be found in our recent publications cited in this disclosure.

The invention combines two phenomena in the one pulse sequence. The first is the phenomenon of polarization transfer. This has been adequately described by Pegg et al., Journal of Magnetic Resonance 44, 32 (1981), by Bendall et al., Journal of Magnetic Resonance 45, 8 (1981) and by other authors cited in those two references. The second phenomenon is the correlated motion of a system of two heteronuclei in the transverse plane of the doubly rotating frame. This correlated motion has been recently described for some specific systems by Bendall et al., Journal of Magnetic Resonance 46, 43 (1982) and descriptions of further specific cases are given in a paper to be published in the Journal of Magnetic Resonance by Bendall et al. (1983).

THE INVENTION

An example of the pulse sequence of the present invention is as follows:

$$\pi/2[S,x] - 1/2J - \pi/2[I]\pi[S] - 1/2J - \theta[S,y]\pi[I] - 1/2J\text{-(acquire I, decouple S as required)}$$

and any application of this pulse sequence to a J-coupled spin system, $IS_n$ (n an integer), where I and S are spin ½ particles. $\pi/2[S,x]$ means a 90° radiofrequency pulse applied to the S spins on the x-axis of the doubly rotating frame. The $\theta$ pulse is a pulse which may be varied depending on the required result. J is the scalar coupling constant between the heteronuclei I and S.

In its simplest form (I and S pulses on-resonance) the pulse sequence of the present invention is as follows:

$$\pi/2[S,x] - 1/2J - \pi/2[I] - 1/2J - \theta[S,y] - 1/2J\text{-(acquire I, decouple S as required)}$$

Thus the present invention consists in the application of three sequential pulses separated by periods and followed by a period during which the heteronuclear scalar coupling interactions are allowed to evolve. During the first period the S spins are allowed to precess for a period of $(2J)^{-1}$ seconds via the heteronuclear scalar coupling interactions with the I spins, which are in pure z eigenstates. The I spins are then also placed in the transverse plane and the heteronuclear scaler coupling interaction is allowed to proceed for a second period of $(2J)^{-1}$ seconds. Finally, the S spins are partially or wholly rotated from the transverse plane to the z axes and the I spins evolve via the heteronuclear scalar coupling interaction during a third $(2J)^{-1}$ second period after which the signal from the I spins is acquired. Decoupled or coupled spectra may be obtained. Precession of the S spins due to chemical shift off-resonance must be refocused for the first two $(2J)^{-1}$ second periods and precession of the I spins due to chemical shift must be refocused for the last two $(2J)^{-1}$ second periods.

The invention includes within its scope any variation of the above example of the pulse sequence of the present invention which retains the three $(2J)^{-1}$ second periods as described above. For example:

(a) Phase-cycling of pulse phases may be employed for spectrum improvement, (e.g. for quadrature detection or e.g. as described by Bodenhausen et al., Journal of Magnetic Resonance 27, 511 (1977)).

(b) Phase-alternation of either the initial $\pi/2[S,x]$ or the final $\theta[S,y]$ pulses may be employed and be accompanied by subtraction of alternate scans for spectrum improvement.

(c) Presaturation of the natural I-magnetization by pre-irradiation of the I nuclei or by use of an initial $\pi/2[I] - 1/2J - \pi[I]$ pulse sequence may be employed for spectrum improvement.

(d) The refocusing pulses $\pi[S]$, $\pi[I]$, may be deleted and replaced at the centre of each of the $(2J)^{-1}$ second periods. Refocusing of chemical shifts using gated decoupling may be used for either of the first or last free precession periods by doubling the length of these periods. For example, if gated decoupling is used in both the first and last free precession periods the pulse sequence would be $\pi/2[S,x]$, (decouple I for $1/2J$), $\pi[S] - 1/2J - \pi/2[I] - 1/4J - \pi[I]\pi[S] - 1/4J - \theta[S,y] - 1/2J - \pi[I]$, (decouple S for $1/2J$), (acquire I, decouple S as required). Gated decoupling may be used for one of the first or last free precession periods with $\pi[I]\pi[S]$ pulses used at the centre of the other free precession periods.

(e) Accurate setting of the precession periods at $(2J)^{-1}$ seconds and the pulse angles at $\pi/2$, $\pi$ and ideal $\theta$ values will produce the maximum signal. The method will still work for slight missetting of these parameters although small unwanted signals may appear in the spectra.

(f) The order of pulses in any of the above sequences written sequentially, as for example $\pi/2[I]\pi[S]$ or $\theta[S,y]\pi[I]$ or $\pi[I]\pi[S]$, may be reversed or the pulses may be applied simultaneously.

(g) Composite pulses (e.g. as described by Freeman et al., Journal of Maagnetic Resonance 38, 453 (1980)) may be used to counteract experimental pulse inhomogeneity and improve any of the above sequences.

The optimum form of the pulse sequence of the present invention would in general include example (a) above and either or both of examples (b) and (c). In a direct comparison of results from the above example of the pulse sequence of the present invention and equivalent results using any of the variations in example (d) above, the variations will not significantly improve the signal amplitude obtained.

In normal use it is often impossible to set the precession periods at exactly $(2J)^{-1}$ second periods (example (e)) because the scalar coupling constant will vary between chemically non-equivalent $IS_n$ groups. In general these periods will be set within 20% error limits of the theoretical values. This will lead to a reduction in the final I signal and unwanted signals may appear in the spectra. It is a major advantage of this invention that these unwanted signals are considerably smaller than those obtained by normal polarization transfer methods under equivalent conditions. This aspect is discussed further in the "Examples of Use of the Invention" section.

Although the above examples are given in terms of an $IS_n$ system where I and S are spin ½ particles, the invention is readily generalized to include any $I_mS_n$ system which is characterised by a single J-coupling constant, where I and S have any spin number. In its simplest form (I and S pulses on-resonance) for such a $I_mS_n$ system, the pulse sequence of the present invention is as follows:

$$\pi/2[S,x] - 1/2J - \phi[I] - 1/2J - \theta[S,y] - 1/2J\text{-(acquire I, decouple S as required)}$$

Like the $\theta$ pulse, the $\phi$ pulse is a pulse which may be varied depending on the required result. In its more general form the invention includes within its scope any variation which retains the three $(2J)^{-1}$ second periods as described above, such variations being exemplified in (a) to (g) above.

The invention also includes within its scope the addition of an incremented period, length t seconds, to any of the three $(2J)^{-1}$ second delay periods which may be used to provide the second frequency dimension in two-dimension applications. These two-dimensional applications of the invention are similar to those that can be obtained by extending the INEPT sequence of Morris and Freeman (Journal of the American Chemical Society 101, 760 (1979)) as we have previously described (Journal of Magnetic Resonance 45, 8 (1981)). The most useful two-dimensional pulse sequences are obtained by using a $\pi[I]$ pulse or $\pi[I]\pi[S]$ pulses at the centre of the additional t period. In some cases, gated decoupling may be used in substitution for these pulses.

THEORETICAL BASIS OF THE INVENTION

In our study (Journal of Magnetic Resonance 45, 8 (1981)) of polarization transfer via the INEPT sequence of Morris and Freeman (Journal of the Americal Chemical Society 101, 760 (1979)) we took into account all the molecules in the sample and obtained a theoretical I spin signal which was the sum of the ordinary signal and the enhanced signal. The ordinary signal arises from the thermal equilibrium Boltzmann excess I spin polarization while the enhanced I spin signal arises from the Boltzmann excess S spin polarization. Because our theory for the mechanism of the pulse sequence of the present invention is nowhere near as straightforward as our theory for the INEPT mechanism of polarization transfer, we simplify the problem from the beginning by considering only the subclass of molecules in the sample which give rise to the enhanced signal. This subclass has the I spin levels equally populated, but retains the Boltzmann excess S spin polarization.

As in previous work (Pegg et al., Journal of Magnetic Resonance 44, 238 (1981)) we again work in the doubly-rotating reference frame. If the radiofrequency pulses are exactly on resonance then in this frame the natural precession frequencies of both the I spins and S spins are reduced to zero. With a resonance offset, the motions include a chemical-shift drift. This overall drift, however, is refocused by the $\pi$ pulses, the first for the S spins and the second for the I spins. Consequently, in the theory below we ignore both the refocusing pulses and chemical shift drift, that is, we deal with the on-resonance case.

In the sections immediately following, a detailed theoretical study of the pulse sequence of the present invention is provided for three individual cases IS, $IS_2$ and $IS_3$ where I and S are spin-half nuclei, the most common heteronuclear systems. For this study the pulse angle $\phi$ is given its optimum value of $\pi/2$ for these cases. In a later section a theoretical study of the pulse sequence of the present invention is provided for the general $I_mS_n$ case, where I and S are nuclei of arbitrary spin, for $\phi$ a variable angle. In a subsequent section, a theoretical study of the pulse sequence of the present invention is provided for two-dimensional applications for $I_mS_n$ systems where I and S are spin-half nuclei.

In order to use the standard z-spin matrix representation for the immediately following cases, we use instead of the x,y,z axes in the doubly-rotating frame, where z coincides with the laboratory z-axis, new axes defined by X=z, Y=x, Z=y. In terms of these axes the doubly rotating frame Hamiltonian (Pegg et al., Journal of Magnetic Resonance 44, 238 (1980)) is $$H = 2\pi J I_X S_X \quad [1]$$

where, as usual, the rapidly oscillating terms are ignored (Pegg and Series, Proceedings of the Royal Society, Series A, 332, 281 (1973)). J is the coupling constant in Hertz, $I_X$ is the X component of the I spin operator and for a $IS_n$ group $S_X$ is the sum of the X components of the individual S spin operators. The coupling between S spins of the group is not observable and can be ignored.

IS CASE

The first $\pi/2$ pulse places each S spin into the transverse plane of the doubly-rotating frame, either parallel or antiparallel to the x-axis (Y-axis) depending on its initial orientation with respect to the static field. We consider firstly the molecules with spins along the $+x$ axis, of number $N_+$, say. Half of these will have their I spins in the $+z$ direction and half in the $-z$ direction. Thus the S spin precession during the first $(2J)^{-1}$ second time period will leave us with half these S spins along the $+y$ axis and half along the $-y$ axis. The $\pi/2[I]$ pulse puts the I spins in the corresponding $+y$ and $-y$ directions. Thus in terms of a y-eigenstate (i.e. a Z-eigenstate) description these molecules are divided equally, with $\frac{1}{2}N_+$ in the state $|+,+>$ and $\frac{1}{2}N_+$ in the state $|-,->$ where the sign before the comma refers to the I state and the sign after the comma to the S state.

During the second $(2J)^{-1}$ second time period these two states evolve to $U(t)|+,+>$ and $U(t)|-,->$ where the time displacement operator is given by $$U(t) = \cos Ht - i \sin Ht \quad [2]$$

with the cos and sin functions defined by their series. We will be interested in the special case $t=(2J)^{-1}$.

To evaluate $U(t)|+,+>$ we note that $|+,+>$ is an eigenstate of the operator $(4I_XS_X)^{2m}$, where m is a positive integer, with unit eigenvalue. Consequently, $$\cos Ht|+,+> = \cos(\tfrac{1}{2}\pi Jt)|+,+>$$

Also it follows that $$(4I_X S_X)^{2m+1} |+,+\rangle = 4I_X S_X |+,+\rangle - |-,-\rangle \quad [3]$$

and so $$\sin Ht |+,+\rangle = \sin(\tfrac{1}{2}\pi J t)|-,-\rangle \quad [4]$$

Thus $$U(t)|+,+\rangle = \cos(\tfrac{1}{2}\pi J t)|+,+\rangle - i \sin(\tfrac{1}{2}\pi J t)|-,-\rangle \quad [5]$$

which for $t = (2J)^{-1}$ gives $$U(t)|+,+\rangle = 2^{-\frac{1}{2}}|+,+\rangle - i 2^{-\frac{1}{2}}|-,-\rangle \quad [6]$$

and, from symmetry $$U(t)|-,-\rangle = 2^{-\frac{1}{2}}|-,-\rangle - i 2^{-\frac{1}{2}}|+,+\rangle \quad [7]$$

We note that the final superposition state does not contain terms of the type $|+,-\rangle$ and thus if an S spin is found by some measurement to have flipped relative to the Z-axis, the attached I spin must also be found to have flipped. There are no single flips.

The final $(2J)^{-1}$ second time period in the sequence will merely change the phase of the I signal components, so we ignore it for now and consider the effect of a measurement immediately after the $\theta$-pulse. This measurement will detect I spins processing at two frequencies, dependent on whether the attached S spins are found up or down along the z-axis (X-axis) after the $\theta$-pulse, that is, parallel ($\uparrow$) or antiparallel ($\downarrow$) to an axis at angle $\phi = \tfrac{1}{2}\pi - \theta$ to the y axis (Z-axis) just before the $\theta$-pulse. To calculate the signal we must therefore express the states [6] and [7] in terms of the S spin basis states $|\uparrow\rangle$ and $|\downarrow\rangle$ relative to an axis at an angle $\phi$ to the Z-axis in the X-Z plane. From basic quantum mechanics, the appropriate transformation is $$|+\rangle = \cos\tfrac{1}{2}\phi |\uparrow\rangle + \sin\tfrac{1}{2}\phi |\downarrow\rangle \quad [8]$$
$$|-\rangle = -\sin\tfrac{1}{2}\phi |\uparrow\rangle + \cos\tfrac{1}{2}\phi |\downarrow\rangle$$

Substitution of [8] into [6] and [7] gives $$U(t)|+,+\rangle = 2^{-\frac{1}{2}}|\uparrow\rangle(\cos\tfrac{1}{2}\phi|+\rangle + i\sin\tfrac{1}{2}\phi|-\rangle) + \quad [9]$$
$$2^{-\frac{1}{2}}|\downarrow\rangle(\sin\tfrac{1}{2}\phi|+\rangle - i\cos\tfrac{1}{2}\phi|-\rangle)$$
$$U(t)|-,-\rangle = 2^{-\frac{1}{2}}|\uparrow\rangle(-i\cos\tfrac{1}{2}\phi|+\rangle - \sin\tfrac{1}{2}\phi|-\rangle) +$$
$$2^{-\frac{1}{2}}|\downarrow\rangle(-i\sin\tfrac{1}{2}\phi|+\rangle + \cos\tfrac{1}{2}\phi|-\rangle)$$

where $|+\rangle$ and $|-\rangle$ are the I states still in the Z-representation.

To determine the final signal it remains only to recognize that the general state $\cos\tfrac{1}{2}\alpha|+\rangle + i\sin\tfrac{1}{2}\alpha|-\rangle$, describes an I spin in the Y-Z plane (x-y plane) at an angle $\alpha$ to the Z-axis (y-axis), because it results from the action of the rotation operator $\exp(iI_X\pi)$ on $|+\rangle$. Thus from [9] the upfield I signal vector, which is formed by molecules in S state $|\uparrow\rangle$, comprises two equal vectors; one at angle $+\phi$ to the y-axis from the $\tfrac{1}{2}N_+$ molecules in state $U(t)|+,+\rangle$, and one at angle $-\phi$ from the $\tfrac{1}{2}N_+$ molecules in state $U(t)|-,-\rangle$. The probability that an S spin is found in state $|\uparrow\rangle$ is, from the square of modulus of the appropriate coefficient in [9] just $\tfrac{1}{2}$. The net upfield signal vector is thus along the y-axis and is proportional to $\tfrac{1}{2}N_+ \cos\phi (= \tfrac{1}{2}N_+ \sin\theta)$.

Similarly, the downfield signal vector has the same magnitude but is oppositely directed. The final $(2J)^{-1}$ evolution period brings the two signal components into phase along the x-axis.

The second set of molecules, of number $N-$, have their S spins initially in the opposite direction to the $N_+$ molecules considered above. Thus just after the first $\pi/2[I]$ pulse, we have $\tfrac{1}{2}N_-$ molecules in state $|+,-\rangle$ and $\tfrac{1}{2}N_-$ in $|-,+\rangle$. We can go through a similar derivation to that above, but it is not difficult to see that the results for $U(t)|+,-\rangle$ and $U(t)|-,+\rangle$ are obtainable directly from [9] by the interchanges $|\uparrow\rangle$ with $|\downarrow\rangle$ and $\phi$ with $-\phi$. The signal vector components from the $N_-$ molecules are then seen to be oppositely directed to the same frequency component vectors from the $N_+$ molecules.

The total signal is thus a doublet with equal components proportional to $\tfrac{1}{2}(N_- - N_+) \sin\theta$. $(N_- - N_+)$ is, of course, just the S spin Boltzmann excess. The ordinary I signal resulting from the I polarization, on the other hand, has two equal components, each proportional to one-half the I Boltzmann excess by the same constant of proportionality. Thus the enhancement is $(\gamma_S/\gamma_I) \sin\theta$ in the usual high temperature approximation, where $\gamma_S$ and $\gamma_I$ are the respective gyromagnetic ratios. The maximum enhancement is thus $(\gamma_S/\gamma_I)$ and occurs at $\theta = \pi/2$.

IS$_2$ CASE

We let $N_{++}$ be the number of molecules containing a IS$_2$ group with both S spins initially parallel to the static field. $N_{+-}$, $N_{-+}$, and $N_{--}$ have corresponding obvious meanings. To simplify at this stage we state two results which may be proved by derivations similar to that given below. There is no net contribution to the signal from the $N_{+-}$ and $N_{-+}$ molecules; the signal vectors from the $N_{++}$ molecules are oppositely directed to those from the $N_{--}$ molecules. Consequently, as we showed explicitly for the IS case, we need only consider the signal arising from one group of the molecules and multiply this by the difference between $N_{++}$ and $N_{--}$.

After the first $(2J)^{-1}$ second time period, the states of interest are thus $|+,++\rangle$ and $|-,--\rangle$, this separation occurring exactly as for the IS case. We must then calculate $U(t)|+,++\rangle$ and $U(t)|-,--\rangle$. The most straightforward approach is to calculate the terms in the cos and sin series. H is again given by [1] but now $S_X$ is the sum of the X-components of the two S spin operators. We find $$H|+,++\rangle = \tfrac{1}{2}\pi J(|-,+-\rangle + |-,-+\rangle)$$
$$H^2|+,++\rangle = 2(\tfrac{1}{2}\pi J)^2(|+,++\rangle + |+,--\rangle)$$
$$H^3|+,++\rangle = 4(\tfrac{1}{2}\pi J)^3(|-,+-\rangle + |-,-+\rangle)$$
$$= (\pi J)^2 H|+,++\rangle$$
$$H^4|+,++\rangle = (\pi J)^2 H^2|+,++\rangle$$

The clear recurrence relationships give us, with a little algebra, $$U(t)|+,++\rangle = \tfrac{1}{2}(|+,++\rangle - |+,--\rangle) + \quad [10]$$
$$\tfrac{1}{2}(|+,++\rangle + |+,--\rangle)\cos\pi J t -$$

-continued
$$\tfrac{1}{2}i(|-,+-\rangle + |-,-+\rangle) \sin \pi Jt$$

Thus when $t = (2J)^{-1}$ $$U(t)|+,++\rangle = \tfrac{1}{2}(|+,++\rangle - |+,--\rangle) - \tfrac{1}{2}i(|-,+-\rangle + |-,-+\rangle) \quad [11]$$

and from symmetry $$U(t)|-,--\rangle = \tfrac{1}{2}(|-,--\rangle - |-,++\rangle) - \tfrac{1}{2}i(|+,-+\rangle + |+,+-\rangle) \quad [12]$$

To express the S states in terms of the basis states $|\uparrow\uparrow\rangle, |\downarrow\downarrow\rangle, |\uparrow\downarrow\rangle, |\downarrow\uparrow\rangle$ on the axis at angle $\phi$ we use the S state relations $|++\rangle = |+\rangle|+\rangle$ and so on, and substitute for $|+\rangle$ and $|-\rangle$ from [8] for each S state in [11] and [12]. We obtain eventually $$U(t)|+,++\rangle = \tfrac{1}{2}|\uparrow\uparrow\rangle(\cos\phi|+\rangle + i\sin\phi|-\rangle) + \quad [13]$$
$$\tfrac{1}{2}|\downarrow\downarrow\rangle(-\cos\phi|+\rangle - i\sin\phi|-\rangle) +$$
$$\tfrac{1}{2}(|\uparrow\downarrow\rangle + |\downarrow\uparrow\rangle)(\sin\phi|+\rangle - i\cos\phi|-\rangle)$$

and $$U(t)|-,--\rangle = \tfrac{1}{2}|\uparrow\uparrow\rangle(i\sin\phi|+\rangle - \cos\phi|-\rangle) + \quad [14]$$
$$\tfrac{1}{2}|\downarrow\downarrow\rangle(-i\sin\phi|+\rangle + \cos\phi|-\rangle) +$$
$$\tfrac{1}{2}(|\uparrow\downarrow\rangle + |\downarrow\uparrow\rangle)(-i\cos\phi|+\rangle - \sin\phi|-\rangle)$$

where again $|+\rangle$ and $|-\rangle$ refer to the I states.

The net upfield signal vector, that is from molecules with S spins in state $|\uparrow\uparrow\rangle$, thus has two components at angles $2\phi$ and $180° - 2\phi$ to the y-axis in the x-y plane. Hence the net signal component is proportional to $\sin 2\phi \ (= \sin 2\theta)$ and is along the $-x$ axis. Similarly the net signal vector associated with $|\downarrow\downarrow\rangle$ is also along the $-x$ axis and of equal magnitude. The total vector associated with the middle line is twice the size and is along the $+x$ axis. The final $(2J)^{-1}$ second period will thus bring all three signal components into phase along the x axis. The ratio is 1:2:1 and the magnitude of the decoupled signal proportional to $(N_{--} - N_{++}) \sin 2\theta$. The maximum enhancement is thus $(\gamma_S/\gamma_I)$ and it occurs at $\theta = \pi/4$.

IS$_3$ CASE

Here the signal has two net contributions, one proportional to $N_{---} - N_{+++}$ and one which we can write as proportional to $N_{--+} - N_{++-}$. These contributions are equal because although the first difference is three times the second difference, $N_{-+-}$ and $N_{+--}$ contribute the same signal as $N_{--+}$. After the first $(2J)^{-1}$ second time period we can thus consider the signal as arising from equal numbers of molecules ($N_0$ say) in states $|+,+++\rangle, |+,++-\rangle, |-,--+\rangle$ and $|-,---\rangle$. To find $U(t)|+,+++\rangle$ we use the same approach as for the IS$_2$ case except that here recurrence relations are not as simple to find. We obtain eventually $$U(t)|+,+++\rangle = \tfrac{1}{4}(\cos 3\omega t + 3\cos \omega t)|+,+++\rangle + \quad [15]$$
$$\tfrac{1}{4}(\cos 3\omega t - \cos \omega t)(|+,--+\rangle + |+,-+-\rangle + |+,+--\rangle) -$$
$$\tfrac{1}{4}i(\sin 3\omega t - 3\sin \omega t)(|-,---\rangle) -$$
$$\tfrac{1}{4}i(\sin 3\omega t + \sin \omega t)(|-,-++\rangle + |-,+-+\rangle + |-,++-\rangle)$$

where $\omega = \tfrac{1}{2}\pi J$. For $t = (2J)^{-1}$ we have $$U(t)|+,+++\rangle = \tfrac{1}{4}2^{-\tfrac{1}{2}}|+\rangle(|+++\rangle - \quad [16]$$
$$|--+\rangle - |-+-\rangle - |+--\rangle) +$$
$$\tfrac{1}{4}i2^{-\tfrac{1}{2}}|-\rangle(|---\rangle - |-++\rangle - |+-+\rangle - |++-\rangle)$$

where $|+\rangle$ and $|-\rangle$ outside the brackets are I states. Similarly $$U(t)|+,++-\rangle = \tfrac{1}{4}2^{-\tfrac{1}{2}}|+\rangle(|++-\rangle - \quad [17]$$
$$|---\rangle - |-++\rangle - |+-+\rangle) +$$
$$\tfrac{1}{4}i2^{-\tfrac{1}{2}}|-\rangle(|--+\rangle - |-+-\rangle - |+--\rangle - |+++\rangle)$$

Using $|+++\rangle = |+\rangle|+\rangle|+\rangle$ etc., and substituting from [8] we find, with some rearrangement, $$2\sqrt{2}\, U(t)|+, \quad [18]$$

$$+++\rangle = |\uparrow\uparrow\uparrow\rangle\left(\cos\tfrac{3}{2}\phi|+\rangle + i\sin\tfrac{3}{2}\phi|-\rangle\right) +$$

$$|\downarrow\downarrow\downarrow\rangle\left(-\sin\tfrac{3}{2}\phi|+\rangle + i\cos\tfrac{3}{2}\phi|-\rangle\right) +$$

$$(|\uparrow\uparrow\downarrow\rangle + |\uparrow\downarrow\uparrow\rangle +$$

$$|\downarrow\uparrow\uparrow\rangle)\left(\sin\tfrac{3}{2}\phi|+\rangle - i\cos\tfrac{3}{2}\phi|-\rangle\right) +$$

$$(|\downarrow\downarrow\uparrow\rangle + |\downarrow\uparrow\downarrow\rangle +$$

$$|\uparrow\downarrow\downarrow\rangle)\left(-\cos\tfrac{3}{2}\phi|+\rangle - i\sin\tfrac{3}{2}\phi|-\rangle\right)$$

and $$2\sqrt{2}\, U(t)|+, \quad [19]$$

$$++-\rangle = |\uparrow\uparrow\uparrow\rangle\left(\sin\tfrac{1}{2}\phi|+\rangle - i\cos\tfrac{1}{2}\phi|-\rangle\right) +$$

$$|\downarrow\downarrow\downarrow\rangle\left(-\cos\tfrac{1}{2}\phi|+\rangle - i\sin\tfrac{1}{2}\phi|-\rangle\right) +$$

$$(|\uparrow\uparrow\downarrow\rangle - |\uparrow\downarrow\uparrow\rangle -$$

$$|\downarrow\uparrow\uparrow\rangle)\left(\cos\tfrac{1}{2}\phi|+\rangle + i\sin\tfrac{1}{2}\phi|-\rangle\right) +$$

$$(|\downarrow\downarrow\uparrow\rangle + |\uparrow\downarrow\downarrow\rangle -$$

$$|\downarrow\uparrow\uparrow\rangle)\left(\sin\tfrac{1}{2}\phi|+\rangle - i\cos\tfrac{1}{2}\phi|-\rangle\right)$$

The corresponding expressions for $U|-,---\rangle$ and $U|-,--+\rangle$ can be obtained from [18] and [19] respectively by interchange of + with −, ↑ with ↓ and φ with −φ.

There are four equal vectors of magnitude proportional to $N_0/8$ which comprise the I signal component from molecules in S state $|\uparrow\uparrow\uparrow\rangle$, at angles $3\phi$, $180° + \phi$, $-3\phi$, and $180° - \phi$ to the y axis. This component is thus proportional to $\frac{1}{4}N_0(\cos\phi - \cos 3\phi)$ along the $-y$ axis. After the last $(2J)^{-1}$ second period this vector has precessed to be along the x axis. Similarly we find that the vectors for the other three signal components are also in phase along the x axis at this time and have magnitudes such to give the component ratio 1:3:3:1. Numerically $N_0$ is half the difference between $N_{---}$ and $N_{+++}$, which is a fraction $3\gamma_S/(4\gamma_I)$ of the Boltzmann I spin excess number, of which the fraction $\frac{1}{8}$ contributes to an outer line of the ordinary I spectrum resulting from the I polarization. The enhancement is thus $(\cos\phi - \cos 3\phi)3\gamma_S/(4\gamma_I)$, or in terms of $\theta$, $(\sin\theta + \sin 3\theta)3\gamma_S/(4\gamma_I)$. The maximum enhancement is $1.15(\gamma_S/\gamma_I)$ and it occurs at $0.196\pi$.

SUMMARY OF THE THREE CASES

In each of the three cases, the vectors representing the enhanced signal components are aligned, that is in phase, along the x axis. The ratios of the components are, in the respective cases 1:1, 1:2:1, 1:3:3:1. Hence, for any particular group the enhanced signal has exactly the same form and phase as an ordinary I signal immediately following a $\pi/2[I,y]$ pulse. Only the magnitudes differ with enhancements of $(\gamma_S/\gamma_I)\sin\theta$, $(\gamma_S/\gamma_I)\sin 2\theta$ and $(\sin\theta + \sin 3\theta)(3\gamma_S/4\gamma_I)$.

THE GENERAL SEQUENCE

The above three cases apply to spin-half systems only. For the general group $I_mS_n$ characterized by a single J-coupling constant, where $I_m$ and $S_n$ are systems of an arbitrary number of arbitrary spins, we use the sequence keeping the angle φ variable, $$\pi/2[S,-y]-1/2J-\phi[I,x]\pi[S,y]-1/2J-\theta[S,x-]\pi[I,x]-1/2J-(\text{acquire I, decouple S as required})$$

Note that here, for mathematical convenience, we are now using for the S spins axes rotated about the z-axis through 90° relative to those used previously, that is, y has become x and x has become −y. The Hamiltonian in the doubly-rotating frame remains as $2\pi JI_zS_z$ where now both $\underline{I}$ and $\underline{S}$ are the sums of the individual nuclear angular momentum operators. We have also retained the refocusing π pulses for now. In addition to its chemical shift drift refocusing function, the π[I,x] reverses the effect of the coupled motion occurring in the first two $(2J)^{-1}$ time periods and inverts the initial I polarization, which is zero anyway. The π[S,y] pulse also acts to reverse the coupled motion during the first $(2J)^{-1}$ period and converts the initial $(\pi/2)[S,-y]$ pulse into an effective $(\pi/2)[S,y]$ pulse. This allows us to write the time displacement operator U for the whole sequence in terms of the I and S operators in the form below with the chemical shift drift and the π pulses omitted:

$$U = \exp(-iI_zS_z\pi)\exp(-iS_x\theta)\exp(iI_zS_z\pi)\exp(-iI_x\phi) \times \quad [20]$$

$$\exp(-iI_zS_z\pi)\exp(-iS_y\pi/2)$$

The Schroedinger picture approach used for the previous three particular cases is too unwieldy for the general case, so we work now, instead, in the Heisenberg picture in which the signal is found in terms of the expectation values of the Heisenberg operators $I_x(t)$ and $I_y(t)$, that is, the real and imaginary parts of $I^+(t)$, which in turn, from standard Heisenberg picture quantum mechanics, is given by $$I^+(t) = U^{-1}I^+U \quad [21]$$

The procedure is to substitute [20] into [21] and to simplify the resulting expression by means of the rotational operator expressions which follow from the angular momentum commutation relations. This gives us $$I^+(t) = \quad [22]$$

$$\exp(iS_y\pi/2)\exp(iI_zS_z\pi)\exp(iI_x\phi)I^+\exp(-iI_zS_z\pi)\exp(-iS_x2\theta) \times$$

$$\exp(iI_zS_z\pi)\exp(-iI_x\phi)\exp(-iI_zS_z\pi)\exp(-iS_y\pi/2)$$

We denote by $|m_j\rangle$ the complete set of orthonormal z-microstates of the I system, with the initial states denoted by $|m_i\rangle$ and write $$\langle m_i|I^+(t)|m_i\rangle = \quad [23]$$

$$\sum_j \exp(iS_y\pi/2)\exp(iS_zm_j\pi)\langle m_i|\exp(iI_x\phi)I^+|m_j\rangle \times$$

$$\exp(-iS_zm_j\pi)\exp(-iS_x2\theta)\exp(iS_zm_j\pi) \times$$

$$\langle m_j|\exp(-iI_x\phi)|m_i\rangle\exp(-iS_zm_j\pi)\exp(-iS_y\pi/2)$$

where $m_j$ is an eigenvalue of $I_z$. Because whether the total spin of I is an integer, or integer-plus-half, $m_j - m_i$ must always be an integer. This allows us to write [23] eventually in the form $A + B$ where $$B = -i\Sigma\langle m_i|\exp(iI_x\phi)I^+|m_j\rangle\langle m_j|\exp(-iI_x\phi)|m_i\rangle \times \quad [24]$$

$$\overline{\exp[i(m_j - m_i)\pi]}\sin(S_z2\theta)$$

and A makes a zero contribution to the expectation value $\langle I^+(t)\rangle$. We can simplify B to $$B = -i\sin(S_z2\theta)\langle m_i|\exp(iI_x\phi)I^+\exp(iI_x\phi)|m_i\rangle \quad [25]$$

Expanding $I^+$ in terms of $I_x$ and $I_y$ we find that the term from $I_y$ makes zero contribution to $I^+(t)$, leaving us finally with the signal $$\langle I^+(t)\rangle = \langle I_x\sin(2I_x\phi)\rangle_0\langle\sin(2S_z\theta)\rangle_0 \quad [26]$$

where we have used $$\langle m_i|I_x\cos(2I_x\phi)|m_i\rangle = 0 \quad [27]$$

which follows from the series expansion. Because [26] is real, the signal vector lies along the x-axis.

The subscripts zero in [26] are a reminder that, in accord with the Heisenberg picture, the expectation values are to be obtained in terms of the initial I and S states. From [26] the enhancement E is easily seen to be $$E = \langle I_z\sin(2I_z\phi)\rangle_0\langle\sin(2S_z\theta)\rangle_0\langle I_z\rangle_0^{-1} \quad [28]$$

We note that, by definition, the first factor in [26] is for a spherically symmetric distribution, which allows us to replace x by z in [28], and the second factor will normally be calculated in terms of a high temperature Boltzmann distribution. The formulae [26] and [28] are completely general and are straightforward to calculate for any system $I_mS_n$. For example when I is a single nucleus of spin half or spin one $<I_z \sin(2I_z\phi)>0$ becomes $(\frac{1}{2}) \sin \phi$ and $(\frac{8}{3}) \sin 2\phi$ respectively, which shows us immediately that the first special case of the sequence discussed, in which $\phi$ is fixed at $\pi/2$, will not transfer polarization to a single spin-one nucleus. The optimum value of $\phi$ for such a transfer is $\pi/4$. For two spins one-half we find $<I_z \sin(2I_z\phi)>0$ is $(\frac{1}{2}) \sin 2\phi$. For a single nucleus I of arbitrary spin it is just $\Sigma_j m_j \sin(2m_j\phi)$. The factor $<\sin(2S_z\theta)>0$ is independent of $\phi$ and reduces to the results obtained for the previous special case of the sequence with $\phi=\pi/2$ in the three cases of one, two and three spin-half nuclei. The calculation of this factor for higher order systems is reasonably straightforward. For the group $IS_n$ where I is arbitrary but S is a spin-half, the sequence gives the same signal as does the INEPT sequence as calculated by Pegg et al, Journal of Magnetic Resonance, 44, 32 (1981), when $\phi$ and $\theta$ are set to equal $\pi J$ times the first and second INEPT time periods respectively.

ORDINARY I SIGNAL FROM THE I POLARIZATION

As mentioned earlier, in addition to the enhanced signal, the sequence will also produce an ordinary signal. This comes from the $\phi[I,x]$ pulse converting the I Boltzmann-excess into a non-zero transverse polarization along the y axis. After the two $(2J)^{-1}$ time periods, depending on the spin of the S system, there will be a non-zero component of ordinary I polarization along the $\pm y$ axis, which, being 90° out of phase with the enhanced signal, will cause an overall phase distortion. Thus it is best to remove the ordinary signal. This can be done by an initial equalization of the I spin populations by a $\pi/2[I]-(2J)^{-1}-\pi[I]$ pulse sequence or saturation irradiation just prior to the pulse sequence (example (c) above). The normal signal can also be removed by a suitable phase alternation, for example, at the initial $\pi/2[S]$ pulse, with each alternate scan signal subtracted (example (b) above).

EXTENSIONS OF THE INVENTION TO TWO-DIMENSIONAL NMR SPECTROSCOPY

The sequence of the present invention may be extended for use in two-dimensional NMR spectroscopy by addition of an incremented delay period, time t, to any one of the three $(2J)^{-1}$ time periods. In general the useful two-dimensional sequences are obtained by adding the sequence segment $-t/2-\pi[I]-t/2-$ to either of the first two $(2J)^{-1}$ periods or $-t/2-\pi[I]\pi[S]-t/2-$ to any of the three $(2J)^{-1}$ periods. The former addition provides a period which modulates the final signal at the chemical shift of the S spins and so results in a chemical shift correlation sequence; the latter addition provides a J-modulation period.

Addition of either of those incremented periods to the first $(2J)^{-1}$ period is analogous to their addition to the first precession period of the INEPT sequence, the theory of which has been adequately described for a $IS_n$ system (I and S are spin-half nuclei) elsewhere (Bendall et al, Journal of Magnetic Resonance 45, 8 (1981)). Addition of $-t/2-\pi[I]\pi[S]-t/2-$ to the last $(2J)^{-1}$ period is analogous to J-modulation of an acquired signal by a simple spin-echo sequence which has been adequately described elsewhere for spin-half systems (e.g. Turner et al, Journal of Magnetic Resonance 29, 587 (1978)). Consequently further theoretical descriptions are not included here. It should be noted, however, that for the J-modulation examples, one refocusing pulse is redundant and can be removed, provided the sequence is written in appropriate form. Thus, for example, for the sequence $$\pi/2[S,x]-1/2J-t/2-\pi[I]\pi[S]-t/2--$$
$$\phi[I]\pi[S]-1/2J-\theta[S,y]\pi[I]-1/2J-\text{acquire I}$$

the first $\pi[S]$ pulse refocuses the S spin chemical shift across the first two $(2J)^{-1}$ periods and the t period, making the second $\pi[S]$ pulse unnecessary and in fact disruptive.

A similar refocusing pulse redundancy is obtained when either of the two types of incremented periods are added to the second $(2J)^{-1}$ period. Thus $$\pi/2[S,x]-1/2J-\phi[I]\pi[S]-1/2J-t/2--$$
$$\pi[I]-t/2-\theta[S,y]\pi[I]-1/2J-\text{acquire I}$$

becomes
$$\pi/2[S,x]-1/2J-\phi[I]\pi[S]-1/2J-t/2--$$
$$\pi[I]-t/2-\theta[S,y]-1/2J-\text{acquire I}$$

and, less obviously, the sequence $$\pi/2[S,x]-1/2J-\phi[I]\pi[S]-1/2J-t/2--$$
$$\pi[I]\pi[S]-t/2-\theta[S,y]-1/2J-\text{acquire I}$$

becomes $$\pi/2[S,x]-1/2J-\phi[I]-t/2-\pi[S]-1/2J--$$
$$\pi[I]-t/2-\theta[S,y]-1/2J-\text{acquire I}.$$

Because these latter sequences are not analogous to any previously described two-dimensional sequences, we describe here their theoretical basis for spin-half systems $IS_n$, the systems for which they will find the most use. The experimental verification in turn establishes the principle of redundant refocusing pulses enunciated above.

Again we work in the Heisenberg picture and look firstly at the last sequence above, in which both the chemical shifts are removed by the refocusing pulses. Consequently we ignore both the pulses and the chemical shift and rewrite the sequence, with a trivially obvious but mathematically convenient axis change, as $$\pi/2[S,y]-1/2J-\pi/2[I]-\tau-\theta[S,x]-1/2J-\text{acquire}$$
$$\text{I, decouple S}$$

Note that we have chosen to give $\phi$ its optimum value for I a spin half of $\pi/2$. Keeping it general merely produces an extra factor $\sin \phi$ in the signal for this case. Also we have written $\tau=t+(2J)^{-1}$, and shall further use the symbol $\alpha=2\pi J\tau$.

As in equation [21] we have $$I^+(t)=U^{-1}I^+U \qquad [29]$$

where now $$U=U_2U_1 \qquad [30]$$

with $$U_2=\exp(-iI_zS_z\pi)\exp(-iS_x\theta)\exp(-iI_zS_z\alpha) \qquad [31]$$

$$U_1=\exp(-iI_x\pi/2)\exp(-iI_zS_z\pi)\exp(-iS_y\pi/2) \qquad [32]$$

By use of rotation relations derived from the angular momentum commutation relations, as we used previously, we find $$U_2^{-1} I^+ U_2 = I^+ F(S) \qquad [33]$$

where $$F(s) = \exp(iS_z\beta) \exp(iS_y 2\theta) \exp(iS_z\beta) \qquad [34]$$

with $\beta = (\alpha + \pi)/2$, that is, $\beta = \pi + \pi Jt$. The $I_x$ term of $I^+$ gives a zero contribution to $<I^+(t)>$. The term in $iI_y$ gives us an expression which can be simplified to $$I^+(t)_2 = -iI_z \exp(-iS_x\beta) \exp(iS_z I_z 4\theta) \exp(-iS_x\beta) \qquad [35]$$

Writing $$\exp(iS_z I_z 4\theta) = \cos(iS_z 2\theta) + i2I_z \sin S_z 2\theta \qquad [36]$$

for I a spin one-half and noting that $<I_z>0$ is zero and $I_z^2 = \frac{1}{4}$, we obtain finally the signal $$<I^+(t)> = (\tfrac{1}{2})<\exp(-iS_x\beta) \sin(S_z 2\theta) \exp(-iS_x\beta)> \qquad [37]$$

which, being real, will be along the x axis.

We first calculate [37] for S a single spin-half, by use of the spin-half identity $$\exp(-iS_x\beta) S_z \exp(-iS_x\beta) = S_z \qquad [38]$$

which gives us $$(\tfrac{1}{2})<\exp(-iS_x\beta) \sin(S_z 2\theta) \exp(-iS_x\beta)> = <S_z> \sin\theta \qquad [39]$$

which is independent of $\beta$.

Before proceeding with the calculation for n spins one-half, we note the spin-half relation $$\exp(-iS_x\beta) \cos(S_z 2\theta) \exp(-iS_x\beta) = \cos\theta(\cos\beta - i2S_x \sin\beta) \qquad [40]$$

so when $<S_x>$ is zero the expectation value of this quantity is just $\cos\theta \cos\beta$.

A further point we need is that for the high temperature Boltzmann distribution $<S_z>$ is $(\tfrac{1}{4})K\gamma_S$ where K is a small constant.

For n spins one-half we can expand the operators $\underline{S}$ in [37] as the sum of the n individual spin-half operators. The sine of the sum of the n operators will involve n terms of the type $$\sin(S_z 2\theta) \cos^{n-1}(S_z 2\theta) = 2S_z \sin\theta \cos^{n-1}\theta \qquad [41]$$

where $S_z$ here represents a spin-half operator of one nucleus, and other terms involving higher powers of sin $(S_z 2\theta)$ leading to terms in higher powers of the small constant K, which we can neglect. With each of the n terms we obtain, there is a factor $\exp(-iS_x\beta)$ on the left and right of it, so using [39] and [40], remembering that the n nuclei are initially independent, we obtain a signal $$K\gamma_S(n/4) \sin\theta \cos^{n-1}\theta \cos^{n-1}\beta \qquad [42]$$

We have obtained the signal [42] by ignoring the non-refocusing effects of the refocusing pulses. Including these $\cos\theta$ changes to $-\cos\theta$ in [42], which effect can obviously be compensated by changing instead $\beta$ to $\beta + \pi$. Thus our final signal which includes the refocusing pulse effects can be written in terms of the time t as $$K\gamma_S(n/4) \sin\theta \cos^{n-1}\theta \cos^{n-1}(\pi Jt) \qquad [43]$$

The last factor, the modulation factor, can be written from a trigonometric identity as $$\cos^{n-1}(\pi Jt) = \sum_{M=-n/2}^{n/2} B(n,M) \cos(2\pi JMt) \qquad [44]$$

So we see that in the second dimension, the t dimension, there will be n peaks separated by frequency J whose heights are in the usual binomial coefficient B(n,M) ratio.

To study the other sequence, we must insert an extra factor $\exp(-iS_z\omega_S t)$, where $\omega_S$ is the S chemical shift frequency, into the time displacement operator for which we can use [30], [31] and [32] with $\alpha$ set to $\pi$. This alters F(S) in [34] to $$F(S) = \exp[iS_z(\beta + \omega_S t)] \exp(iS_z 2\theta) \exp[iS_z(\beta - \omega_S t)] \qquad [45]$$

This addition to $\beta$ carries through to [38] and introduces a factor $\cos\omega_S t$ to $S_z$ and another term $S_y \sin\omega_S t$ of which the expectation value is zero. There is no overall effect on the important term $\cos\theta \cos\beta$ of [40], so the final effect is just the introduction of the factor $\cos\omega_S t$ to [43] giving a signal $$K\gamma_S(n/4) \sin\theta \cos^{n-1}\theta \cos^{n-1}(\pi Jt_1) \cos(\omega_S t_2) \qquad [46]$$

where we use $t_1$ and $t_2$ to distinguish the two t times in the two sequences. Obviously for $t_2 = 0$, and $t_1 = t$ we obtain the previous J modulation sequence result and setting $t_1 = 0$, $t_2 = t$ gives us the second sequence studied which clearly gives peaks at the S chemical shift frequency in the second dimension at both $\omega_S$ and $-\omega_S$.

Clearly [46] is also applicable to a combined sequence involving the simultaneous variation of both $t_1$ and $t_2$. For example if we set $t_1 = t_2 = t$, then variation of t will give in the second dimension n J-separated peaks each split into a $\omega_S$-separated doublet if $J > \omega_S$, or if $\omega_S > J$ we would obtain the J multiplet shifted by $\omega_S$ if we are looking, for example, at only the positive side of the second dimension.

A further point to note is that for $\beta = 0$, that is, when we have just the chemical shift sequence, we need not restrict the above theory to I a single spin-half nucleus, the factor $\cos\omega_S t$ arises independently of the I spin, and so the chemical shift sequence is of more general applicability.

APPLICATIONS OF THE INVENTION

Examples of the present invention in use will hereafter be described having regard to the accompanying drawings, in which:

FIGS. 2(a)-2(c) show the subspectra of cholesterol as result from use of the present invention compared with FIG. 2(d) which shows the spectrum obtained using the present invention with $\theta = \pi/4$;

FIG. 4(a) shows a coupled $^{13}C$ spectrum of 2-chlorobutane obtained using the present invention with $\theta = \pi/4$ compared with that using the INEPT sequence in FIG. 4(b); and FIG. 5(a) shows the normal $^{29}Si$ NMR spectrum of $(CH_3)_4Si$ compared with the spectrum obtained by use of the present invention in FIG. 5(b) and to that produced by the INEPT sequence in FIG. 5(c).

COMPARISON WITH THE INEPT PULSE SEQUENCE FOR SPIN-HALF PARTICLES

Figure 1:
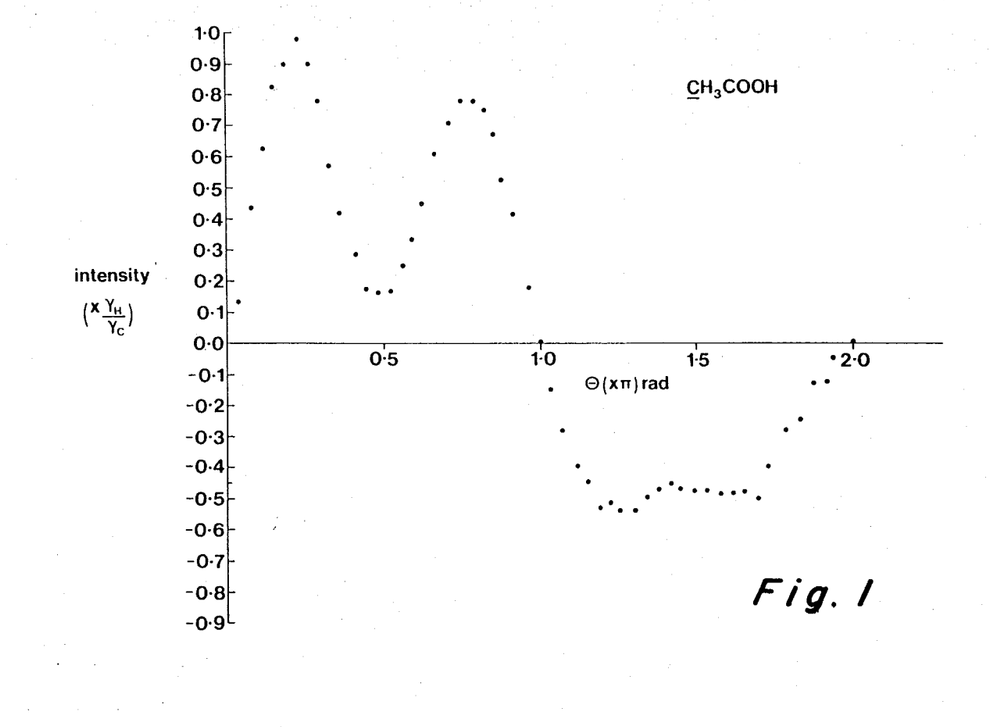
FIG. 1 is a plot on a graph showing the variation of the $^{13}C$ signal enhancement of the CH$_3$ group of CH$_3$COOH as a function of $\theta$ using a pulse sequence in accordance with the present invention.

The decoupled spectrum enhancements for the INEPT sequence following a second precession period, $\Delta$, in which the heteronuclear scaler coupling interactions are allowed to evolve are for spin-half IS, $IS_2$ and $IS_3$: $(\gamma_S/\gamma_I) \sin \pi J\Delta$, $(\gamma_S/\gamma_I) \sin 2\pi J\Delta$ and $(\sin \pi J\Delta + \sin 3\pi J\Delta)(3\gamma_S/4\gamma_I)$ (Pegg et al, Journal of Magnetic Resonance, 44, 32 (1981)). For the pulse sequence of the present invention, because of its distortion-free characteristics for multiple spin-half systems $S_n$, we can say immediately that the decoupled enhancements are identical with the coupled enhancements listed previously. The remarkable result is that these enhancements become identical to those for INEPT if we replace $\theta$ by $\pi J\Delta$. The accuracy of this statement is exemplified by the variation of the $^{13}C$ signal enhancement of the $CH_3$ group of $CH_3COOH$ as a function of $\theta$ using the pulse sequence of the present invention (where $I \equiv C$ and $S \equiv H$) and shown in FIG. 1. To obtain these data the ordinary $^{13}C$ signal was removed (as discussed in the previous section). The intensity of the proton-decoupled $^{13}C$ signal was divided by the intensity of the reverse-gated decoupled (that is, no nuclear Overhauser enhancement) signal to yield the intensity in terms of $\gamma_H/\gamma_C$. The departure from the theoretical $(\sin \theta + \sin 3\theta)(3\gamma_H/4\gamma_C)$ dependence on $\theta$ results from experimental inhomogeneity in the $\theta[C]$ pulse. In addition there is a reduction of about 15% in total enhancement due to inhomogeneity in the other pulses in the sequence.

A number of useful applications of INEPT have been described (Bendall et al, Journal of Magnetic Resonance, 45, 8 (1981) and references cited therein). For applications in which it is necessary to precisely adjust the second precession period, $\Delta$, to correspond to particular enhancements as given by the above enhancement formulae, the invented sequence has an obvious advantage. Normally, heteronuclear J values vary between chemically non-equivalent $IS_n$ groups in any molecule and so it is generally not possible to set the $\Delta$ period of the INEPT sequence to exactly correspond to a particular required set of enhancements for all $IS_n$ groups in a sample. However, the equivalent variable, $\theta$, in the invented sequence is not dependent on J and thus a particular required set of enhancements for all $IS_n$ groups in a sample can be achieved. The departure of the experimental enhancements from the theoretical formulae for the invented sequence, because of inhomogeneity in the $\theta$ pulse, can be allowed for experimentally because the inhomogeneity is the same for all $IS_n$ groups in a sample. Thus the pulse sequence of the present invention yields results superior to INEPT for these applications.

The most striking difference between the pulse sequence of the present invention and INEPT can be observed by comparing coupled spectra when $S_n$ is a multiple spin-half system. The sequence of this invention produces a distortionless magnification or enhancement compared to the ordinary I signal from the I polarization, without change of relative phase between multiplet components of the S-coupled I multiplets, within each $IS_n$ multiplet, or between different $IS_n$ multiplets. This can be contrasted with the results of the INEPT sequence which turns an ordinary $IS_2$ 1:2:1 triplet into a $-1:1$ doublet for $\Delta 32$ 0, and gives an ordinary $IS_3$ 1:3:3:1 triplet the ratio $-1:-1:1:1$ for $\Delta = 0$. Furthermore, for INEPT the phases of the multiplet components vary with $\Delta$ and in a different way for each $IS_n$ group of each different value of n. For the invented sequence only the signal magnitude is dependent on $\theta$. This property makes the invented sequence considerably superior to INEPT for studying coupled spectra.

EXAMPLES OF USE OF THE INVENTION FOR SPIN-HALF NUCLEI

Figure 2:
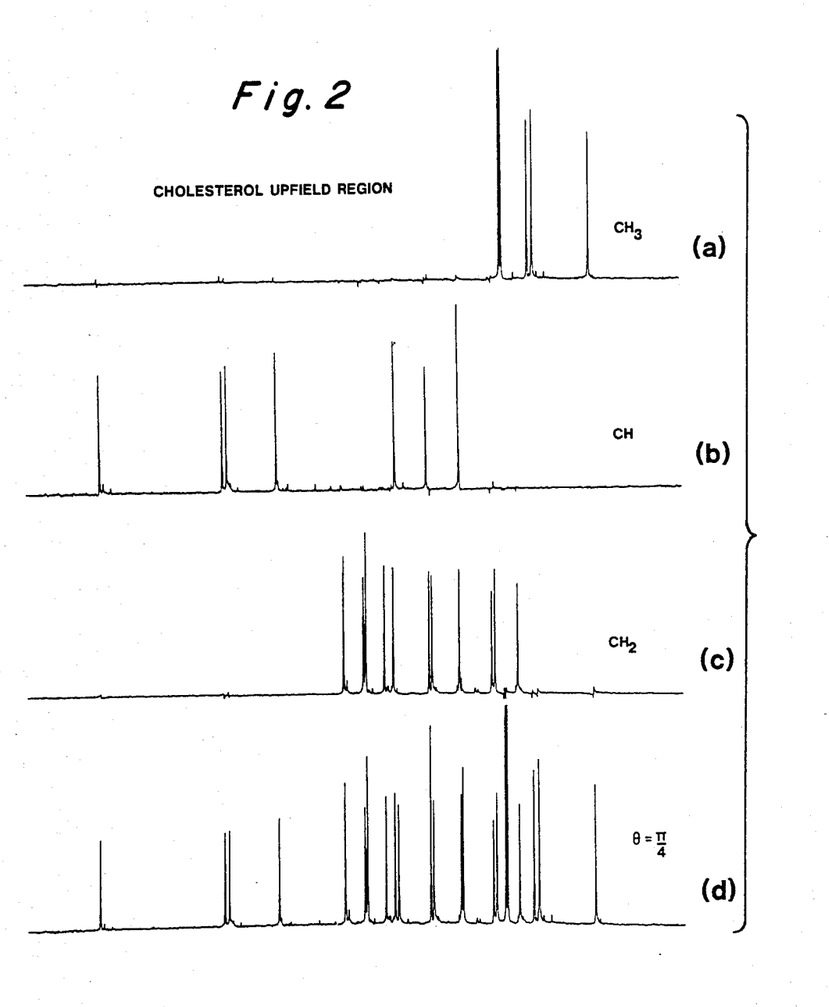
Figure 3:
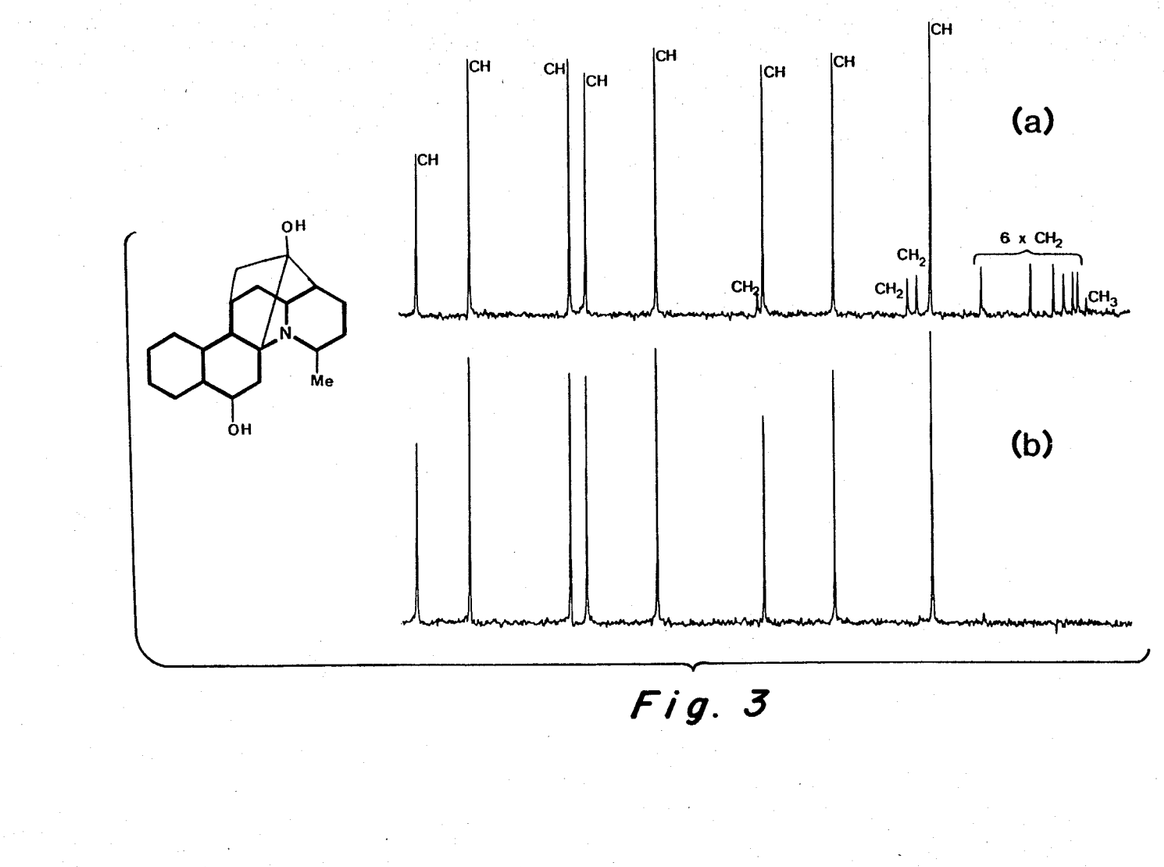
FIGS. 3(a) and 3(b) show a CH subspectrum of himgaline in accordance with the present invention as per FIG. 3(b) compared with that obtained using the INEPT sequence in FIG. 3(a)

A simple immediate application of the pulse sequence of the present invention, which we have found very useful, is in the editing of decoupled $^{13}C$ spectra, that is, separating out the methine (CH), methylene ($CH_2$) and methyl ($CH_3$) sub-spectra. Previously we have used INEPT for this (Doddrell and Pegg, Journal of the American Chemical Society, 102, 6388 (1980)), and obviously we obtain similar results by use of the variable $\theta$ for the pulse sequence of the present invention in place of $\pi J\Delta$ for INEPT. The advantage of the present sequence, as noted above, is that $\theta$ is not a function of J and so the editing is less sensitive to variation of J in the sample. Also, for different $\Delta$ values for INEPT, the different effects of relaxation make cancellation of signals by subtraction at two different values of $\Delta$ difficult. On the other hand, although there is a degradation in signal as a function of $\theta$ for the present pulse sequence due to pulse inhomogeneity, this is essentially controllable because it is the same for all molecular groups in the sample. To edit a $^{13}C$ spectrum, spectra are obtained using the present sequence for three different values of $\theta$, $\theta_1 = \pi/4$, $\theta_2 = \pi/2$, and $\theta_3 = 3\pi/4$. For perfectly homogeneous $\theta$ pulses, the $\theta_2$ spectrum is the CH $^{13}C$ subspectrum, and adding and subtracting the three spectra in the manner $\frac{1}{2}(\theta_1 - \theta_3)$ and $[\frac{1}{2}(\theta_1 + \theta_3) - \theta_2 \sin \pi/4]$ gives the $CH_2$ and $CH_3$ subspectra respectively. However, experimentally, the $\theta$ pulses are never perfectly homogeneous. To overcome this a satisfactory experimental procedure is the following: Using a known compound, and with the $(2J)^-$ second time periods set by assuming an average $^1J_{13C-1H}$ value (say 135 Hz), the $\theta$ pulse time is adjusted accurately to average $\pi/2$ across the sample by nulling, within an accuracy of say 5%, the $CH_2$ signals. The pulse times for $\theta = \pi/4$ and $\theta = 3\pi/4$ are directly obtained from this $\pi/2$ pulse time. The CH, $CH_2$ and $CH_3$ subspectra may then be generated by the respective combinations $[\theta_2 - z(\theta_1 + x.\theta_3)]$, $\frac{1}{2}(\theta_1 - x.\theta_3)$ and $[\frac{1}{2}(\theta_1 + x.\theta_3) - y.\theta_2]$, where the experimental parameters, x, y and z are determined by obtaining the optimum cancellation of unwanted signals in the subspectra of the known compound. These same parameters may then be used to generate subspectra of unknown compounds because the parameters will be constant for a particular spectrometer set-up. As an example, the subspectra of cholesterol are shown in FIGS. 2(a)-2(c) and compared to the spectrum obtained using $\theta = \pi/4$ in FIG. 2(d). In the latter spectrum all CH, CH$_2$ and CH$_3$ signals are shown with the CH signals reduced to sin $\pi/4$ of their maximum size. These spectra were obtained using a standard 10 mm broadband probe on a Bruker CXP-300 spectrometer (modified to provide x and y $^1$H pulse phases) for which x=1.15, y=0.75 and z=0.03. As another example, a CH subspectrum of himgaline obtained using this equipment and these parameter values, is shown in FIG. 3(b) and compared to the inferior spectrum obtained using the INEPT sequence (FIG. 3(a)) for which an average $J_{13C-1H}$ value of 135 Hz was also used. Other correction procedures for eliminating or reducing the deleterious effects of pulse inhomogeneity are possible (for example, use of composite pulses).

Figure 4:
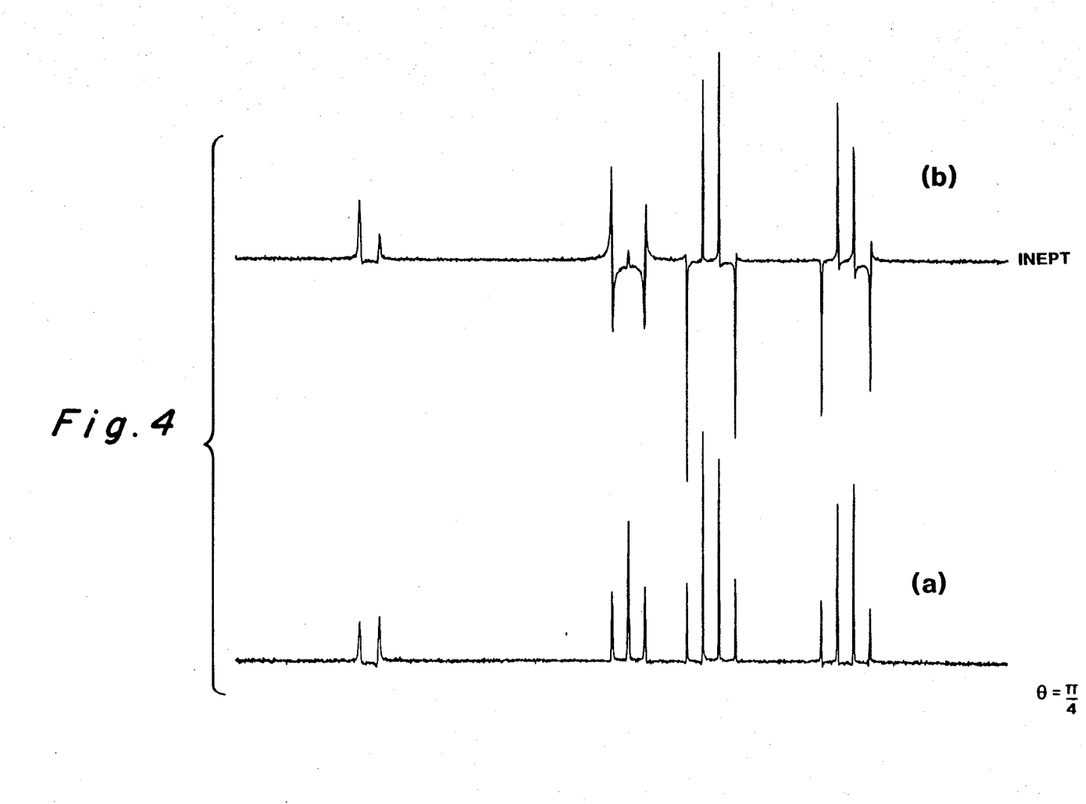

As an example of the use of the pulse sequence of the present invention in studying coupled spectra, a coupled $^{13}$C spectrum of 2-chlorobutane obtained with the $\theta$ pulse set at $\pi/4$ is shown in FIG. 4(a) and compared to a spectrum obtained using the INEPT sequence with $\Delta = (2J)^{-1}$ seconds in FIG. 4(b). Note the lack of phase coherency between and within the CH, CH$_2$ and CH$_3$ multiplets for INEPT and the complete phase coherency, at least within the errors introduced by pulse inhomogeneity, obtained using the invented sequence. The above observations provide an experimental verification of the predictions concerning relative phase coherency made in the previous section. These spectra were obtained using the same equipment as for the previous editing application above. Using the same procedure as for the editing application, edited coupled spectra may also be obtained using the invented sequence. This is extremely difficult to do using the INEPT sequence.

Figure 5:
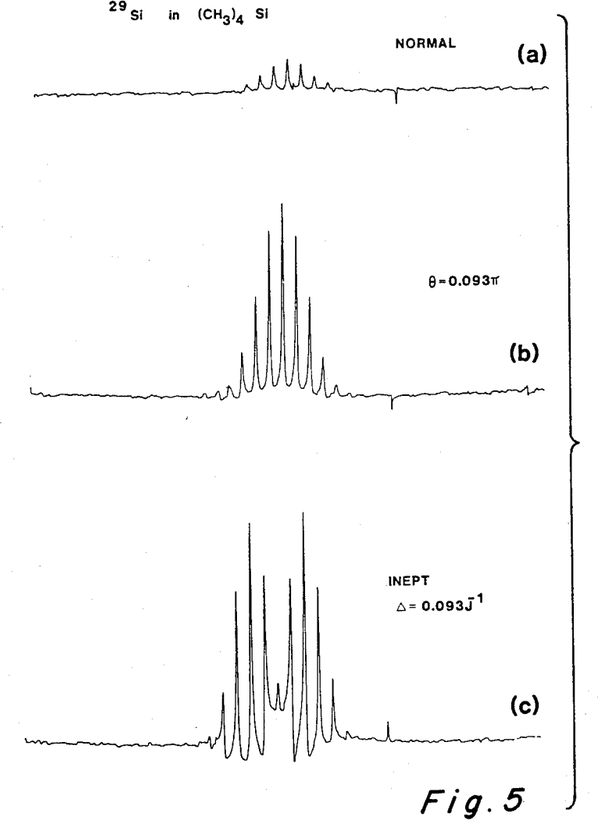

As noted previously, for IS$_n$ systems where I is a single arbitrary spin and S is a spin-half, $\phi/(\pi J)$ and $\theta/(\pi J)$ for the sequence of this invention determine the signal in the same way as do the first and second time periods respectively of the INEPT sequence. This correspondence means that enhancement values can be obtained directly from the INEPT enhancements for this particular case. As an example, an enhancement of 2.147 ($\gamma_S/\gamma_I$) can be expected for each multiplet component in a coupled I spectrum of an IS$_{12}$ group for $\theta = 0.093$ using the invented sequence. An example of this is shown in FIG. 5(b), the $^{29}$Si NMR spectrum of (CH$_3$)$_4$Si using the sequence of this invention with $\theta$ set at 0.093$\pi$. Because of pulse inhomogeneity, the signal intensity is about 15% less than the theoretical enhancement over the normal or ordinary signals obtained after a $\pi/2$[Si] pulse. A spectrum of the latter is included in FIG. 5(a) for comparison. Also included, in the FIG. 5(c) is the inferior, distorted spectrum obtained using the INEPT sequence. These spectra were obtained using a Bruker HX-90 spectrometer, upgraded with an Aspect-2000 computer and associated CXP-series pulse modulation electronics to provide x and y $^1$H pulse phases, and a standard 10 mm broadband probe.

EXAMPLES OF USE OF THE INVENTION FOR OTHER THAN SPIN ½ PARTICLES

Figure 6:
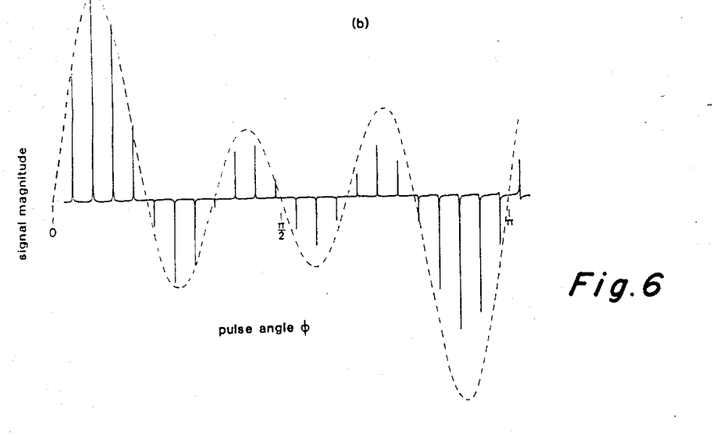
FIG. 6 shows a series of $^{10}B$ NMR spectra of the ion $^{10}BH_4^-$ as a function of $\phi$ using a pulse sequence in accordance with the present invention with the pulse angle $\theta$ set at 30°.

An example of the use of the pulse sequence of the present invention is shown in FIG. 6 for the ion $^{10}$BH$_4^-$ where I≡$^{10}$B, spin 3, and S≡$^1$H. Except for inhomogeneity of the $\phi$ pulse the dependence of the experimental signal intensity on the $\phi$ pulse angle is clearly in agreement with the theoretical continuous curve (intensity proportional) to 3 sin $\phi$ + 2 sin 4$\phi$ + sin 2$\phi$).

Although the BH$_4^-$ example is probably not a particularly useful one, useful applications are at hand. For example, polarization transfer from deuterium (spin 1) to $^{13}$C (spin ½) would be extremely useful in deuterium labelling studies in chemistry because a $^{13}$C spectrum of just those carbons directly bonded to deuterium would be obtained.

Some applications for systems containing other than spin ½ particles may be used using the INEPT sequence. However the sequence of the present invention will have the twin advantages of less pulses and less dependence on the need to match the sequence delay times with the J coupling constant as already noted for systems containing only spin ½ particles.

EXAMPLES OF USE OF THE INVENTION FOR TWO-DIMENSIONAL NMR SPECTROSCOPY

To exemplify the use of the sequence of the present invention as extended to two-dimensional NMR spectroscopy three examples are given, all in terms of $^{13}$C$^1$H$_n$ systems.

The sequence $$\pi/2[H,x] - 1/2J - t/2 - \pi[C] - t/2 - \pi/2[C] - 1/2J - \theta[H,y]\pi[C] - 1/2J - (\text{acquire } ^{13}\text{C, decouple } ^1\text{H})$$

will produce resonances in the second dimension at the single bond $^{13}$C-$^1$H J value split by proton homonuclear coupling. This is analogous to the same type of two dimensional spectrum that can be obtained using an extended INEPT sequence (Bendall et al, Journal of Magnetic Resonance 45, 8 (1981)). However, the sequence of the present invention has an advantage over such an extended INEPT sequence in that it contains two fewer pulses. In addition, edited two-dimensional spectra may be obtained in the same way as edited one-dimensional spectra, and these will be more accurate than could be obtained using an extended INEPT sequence.

The sequence $$\pi/2[H,x] - 1/2J - \pi/2[C]\pi[H] - 1/2J - \theta[H,y] - t/2 - \pi[C]\pi[H] - t/2 - 1/2J - (\text{acquire } ^{13}\text{C decouple } ^1\text{H})$$

will produce normal coupled $^{13}$C-$^1$H multiplets in the second dimension. The sequence contains one less pulse than the equivalent INEPT sequence and produces undistorted multiplets, unlike INEPT (see Bendall et al, Journal of Magnetic Resonance 45, 8 (1981)). The sequence involves polarization transfer unlike the simple spin-echo technique and accurate edited two-dimensional spectra may be obtained unlike both the equivalent INEPT and spin-echo techniques.

Figure 7:
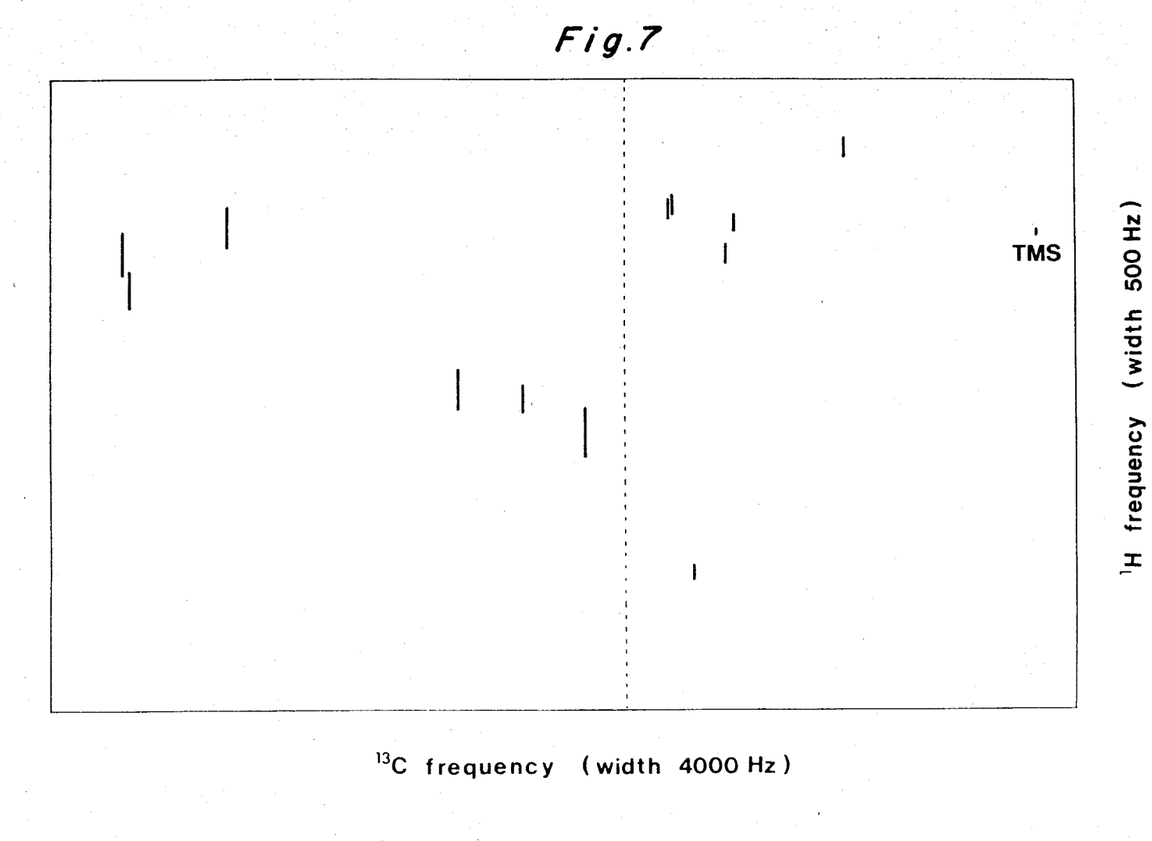
FIG. 7 shows a positive contour plot of a two dimensional $^{13}C$ NMR spectrum for the compound cholesterol acetate using a chemical shift correlation pulse sequence in accordance with the present invention.

The sequence $$\pi/2[H,x] - 1/2J - \pi/2[C]\pi[H] - 1/2J - t/2 - \pi[C] - t/2 - \theta[H,y] - 1/2J - (\text{acquire } ^{13}\text{C, decouple } ^1\text{H})$$

will produce a two-dimensional chemical shift correlation spectrum. The sequence contains two less pulses than the equivalent INEPT sequence (see Bendall et al., Journal of Magnetic Resonance 45, 8 (1981)) and again accurate edited two-dimensional spectra may be obtained unlike the equivalent INEPT technique. FIG. 7 shows a positive contour plot of a two-dimensional spectrum of cholesterol acetate using the above sequence of the present invention with $\theta=3\pi/4$. Thus only CH$_3$ and CH groups appear in the spectrum shown because CH$_2$ groups give negative peaks. This spectrum was obtained using a standard Bruker WM-250 spectrometer and a standard 10 mm broadband probe.

We claim:

1. A method of operating a nuclear magnetic resonance spectrometer in relation to a sample comprising two types of heteronuclei, said method comprising applying three sequential radiofrequency pulses to said sample, the first pulse being applied to the first type of nuclei, the second pulse being applied to the second type of nuclei and the third pulse being applied to the first type of nuclei, adjacent pulses being separated by a period and the third pulse being followed by a period during which heteronuclear scalar coupling interactions between the two types of nuclei evolve, and then detecting and Fourier transforming the free induction decay of the second type of nuclei.

2. A method as claimed in claim 1 wherein the period between each of said pulses is of a duration 1/2J seconds wherein J is the scalar coupling constant between the heteronuclei.

3. A method as claimed in claim 1 wherein the precession of the spins of the first type of nuclei, because of chemical shift off-resonance, is refocused for the first two periods and the precession of the spins of the second type of nuclei, because of chemical shift off-resonance, is refocused for the last two periods.

4. A method as claimed in claim 1 wherein the pulse sequence is of the form $\pi/2[S,x] - 1/2J - \pi 2]I] - 1/2J - \theta[S,y] - 1/2J -$ (acquire I, decouple S as required), wherein J is the coupling constant between the heteronuclei designated I and S; I and S are any spin ½ particles of a J-coupled spin system IS$_n$ (n is an integer); $\pi/2[S,x]$ means a 90° radiofrequency pulse applied to the S spins on an axis (x) of the doubly rotating frame; $\theta[S,y]$ means a $\theta$ radiofrequency pulse applied to the S spins on an axis (y) orthogonal to the axis (x) of application of the $\pi/2[S,x]$ pulse; $\pi/2[I]$ means a 90° radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins.

5. A method as claimed in claim 1 wherein the pulse sequence is the form $\pi/2[S,x] - 1/2J - \phi[I] - 1/2J - \theta[S,y] - 1/2J -$ (acquire I, decouple S as required), wherein J is the coupling constant between the heteronuclei designated I and S; I and S are particles of any spin number in a J-coupled spin system I$_m$S$_n$ (n and m are integers); $\pi/2[S,x]$ means a 90° radiofrequency pulse applied to the S spins on an axis (x) of the doubly rotating frame; $\theta[S,y]$ means a $\theta$ radiofrequency pulse applied to the S spins on an axis (y) orthogonal to the axis (x) of application of the $\pi/2[S,x]$ pulse; $\phi[I]$ means a $\phi$ radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins.

6. A method as claimed in claim 4 or 5 wherein the precession of the S spins, because of chemical shift off-resonance, is refocused for the first two periods and the precession of the I spins, because of chemical shift off-resonance, is refocused for the last two periods.

7. A method as claimed in claim 1 wherein the pulse sequence is of the form $\pi/2[S,x] - 1/2J - t/2 - \pi[I] - t/2 - \phi[I] - 1/2J - \theta[-S,y] - 1/2J -$ (acquire I, decouple S as required);

or wherein the pulse sequence is of the form $\pi/2[S,x] - 1/2J - t/2 - \pi[I]\pi[S] - t/2 -$
$\phi[I] - 1/2J - \theta[S,y] - 1/2J -$ (acquire I, decouple S as required);

or wherein the pulse sequence is of the form $\pi/2[S,x] - 1/2J - \phi[I] - 1/2J - \theta[S,y] - 1/2J - t/2 -$
$\pi[I]\pi[S] - t/2 -$ (acquire I, decouple S as required);

or wherein the pulse sequence is of the form $\pi/2[S,x] - 1/2J - \phi[I] - 1/2J - t/2 - \pi[I] - t/2 - \theta[-S,y] - 1/2J -$ (acquire I, decouple S as required);

or wherein the pulse sequence is of the form $\pi/2[S,x] - 1/2J - \phi[I] - t/2 - \pi[S] - 1/2J -$
$\pi[I] - t/2 - \theta[S,y] - 1/2J -$ (acquire I, decouple S as required), wherein J is the coupling constant between the heteronuclei designated I and S; I and S are particles of any spin number in a J-coupled spin system I$_m$S$_n$ (n and m are integers); $\pi/2[S,x]$ means a 90° radiofrequency pulse applied to the S spins on an axis (x) of the doubly rotating frame; $\theta[S,y]$ means a $\theta$ readiofrequency pulse applied to the S spins on an axis (y) orthogonal to the axis (x) of application of the $\pi/2[S,x]$ pulse; $\phi[I]$ means a $\phi$° radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins; $\pi[S]$ means a 180° radiofrequency pulse applied to the S spins; $\pi[I]$ means a 180° radiofrequency pulse applied to the I spins; wherein the order of pulses written $\pi[I]\pi[S]$ may be reversed or the pulses may be applied simultaneously; and wherein the additional period t is incremented to provide the second time dimension for two-dimensional nuclear magnetic resonance spectroscopy applications.

8. A method as claimed in claim 7 wherein the precession of the S spins, because of chemical shift off-resonance, is refocused for the first two 1/2J periods and the precession of the I spins, because of chemical shift off-resonance, is refocused for the last two 1/2J periods, wherein any sequence written $-1/2J - t/2 - \pi[I]$ may be changed to $-t/2 - \pi[I] - 1/2J -$ or any sequence written $-1/2J - t/2 - \pi[I]\pi[S]$ may be changed to $-t/2 - \pi[I]\pi[S] - 1/2J -$ and wherein the sequence written $-t/2 - \pi[S] - 1/2J - \pi[I] - t/2 -$ may be changed to $-t/2 - 1/2J - \pi[I]\pi[S] - t/2 -$ or $-t/2 - \pi[I]\pi[S] - 1/2J - t/2 -$.

9. A method as claimed in claim 1 wherein the pulse sequence is of the form $$\pi/2[S,x] - 1/2J - \pi/2[I]\pi S] - 1/2J - \theta[S,y]\pi\text{-}[I] - 1/2J - \text{(acquire I, decouple S as required);}$$

wherein J is the coupling constant between the heteronuclei designated I and S; I and S are any spin $\frac{1}{2}$ particles of a J-coupled spin system $IS_n$ (n is an integer); $\pi/2[S,x]$ means a 90° radiofrequency pulse applied to the S spins on an axis (x) of the doubly rotating frame; $\theta[S,y]$ means a $\theta$ radiofrequency pulse applied to the S spins on an axis (y) orthogonal to the axis (x) of application of the $\pi/2[S,x]$ pulse; $\pi/2[I]$ means a 90° radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins; $\pi[S]$ means a 180° radiofrequency pulse applied to the S spins; $\pi[I]$ means a 180° radiofrequency pulse applied to the I spins; and wherein the order of pulses written $\pi/2[I]\pi[S]$ or $\theta[S,y]\pi[I]$ may be reversed or the pulses may be applied simultaneously.

10. A method as claimed in claim 1 wherein the pulse sequence is of the form $$\pi/2[S,x] - 1/2J - \phi[I]\pi[S] - 1/2J - \theta[S,y]\pi[I] - 1/2J - \text{(acquire I, decouple S as required);}$$

wherein J is the coupling constant between the heteronuclei designated I and S; I and S are particles of any spin number in a J-coupled spin system $I_mS_n$ (n and m are integers); $\pi/2[S,x]$ means a 90° radiofrequency pulse applied to the S spins on an axis (x) of the doubly rotating frame; $\theta[S,y]$ means a $\theta°$ radiofrequency pulse applied to the S spins on an axis (y) orthogonal to the axis (x) of application of the $\pi/2[S,x]$ pulse; $\phi[I]$ means a $\phi°$ radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins; $\pi[S]$ means a 180° radiofrequency pulse applied to the S spins; $\pi[I]$ means 180° radiofrequency pulse applied to the I spins; and wherein the order of pulses written $\phi[I]\pi[S]$ or $\theta[S,y]\pi[I]$ may be reversed or the pulses may be applied simultaneously.

11. A method as claimed in claim 1 wherein the pulse sequence is of the form $$\pi/2[S,x] - 1/2J - t/2 - \pi[I] - t/2 -\!-\\ \phi[I]\pi[S] - 1/2J - \theta[S,y]\pi[I] - 1/2J - \text{(acquire I, decouple S as required);}$$

or wherein the pulse sequence is of the form $$\pi/2[S,x] - t/2 - \pi[I] - t/2 - 1/2J -\!-\\ \phi[I]\pi[S] - 1/2J - \theta[S,y]\pi[I] - 1/2J - \text{(acquire I, decouple S as required);}$$

or wherein the pulse sequence is of the form $$\pi/2[S,x] - 1/2J - t/2 - \pi[I]\pi[S] - t/2 -\!-\\ \phi[I] - 1/2J - \theta[S,y]\pi[I] - 1/2J - \text{(acquire I, decouple S as required);}$$

or wherein the pulse sequence is of the form $$\pi/2[S,x] - 1/2J - \phi[I]\pi[S] - 1/2J - \theta[S,y] - t/2 -\!-\\ \pi[I]\pi[S] - t/2 - 1/2J - \text{(acquire I, decouple S as required);}$$

or wherein the pulse sequence is of the form $$\pi/2[S,x] - 1/2J - \phi[I]\pi[S] - 1/2J - t/2 -\!-\\ \pi[I] - t/2 - \theta[S,y] - 1/2J - \text{(acquire I, decouple S as required);}$$

wherein J is the coupling constant between the heteronuclei designated I and S; I and S are particles of any spin number in a J-coupled spin system $I_mS_n$ (n and m are integers); $\pi/2[S,x]$ means a 90° radiofrequency pulse applied to the S spins on an axis (x) of the doubly rotating frame; $\theta[S,y]$ means a $\theta°$ radiofrequency pulse applied to the S spins on an axis (y) orthogonal to the axis (x) of application of the $\pi/2[S,x]$ pulse $\phi[I]$ means $\phi°$ radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins; $\pi[S]$ means a 180° radiofrequency pulse applied to the S spins; $\pi[I]$ means a 180° radiofrequency pulse applied to the I spins; wherein the order of pulses written $\phi[I]\pi[S]$ or $\pi[I]\pi[S]$ or $\theta[S,y]\pi[I]$ may be reversed or the pulses may be applied simultaneously; and wherein the additional period t is incremented to provide the second time dimension for two-dimensional nuclear magnetic resonance spectroscopy applications.

12. A method as claimed in claim 1 wherein the pulse sequence is of the form $$\pi/2[S,x] - 1/2J - t/2 - \pi[I]\pi[S] - t/2 -\!-\\ \phi[I]\pi[S] - 1/2J - \theta[S,y]\pi[I] - 1/2J - \text{(acquire I, decouple S as required;}$$

or wherein the pulse sequence is of the form;

$$\pi/2[S,x] - 1/2J - \phi[I]\pi[S] - 1/2J - \theta[S,y]\pi\text{-}[I] - 1/2J - t/2 - \pi[I]\pi[S] - t/2 - \text{(acquire I, decouple S as required);}$$

or wherein the pulse sequence is of the form $$\pi/2[S,x] - 1/2J - \phi[I]\pi[S] - 1/2J - t/2 -\!-\\ \pi[I] - t/2 - \theta[S,y]\pi[I] - 1/2J - \text{(acquire I, decouple S as required);}$$

or wherein the pulse sequence is of the form $$\pi/2[S,x] - 1/2J - \phi[I]\pi[S] - t/2 - \pi[S] - 1/2J -\!-\\ \pi[I] - t/2 - \theta[S,y]\pi[I] - 1/2J - \text{(acquire I, decouple S as required);}$$

wherein J is the coupling constant between the heteronuclei designated I and S; I and S are particles of any spin number in a J-coupled spin system $I_mS_n$ (n and m are integers); $\pi/2[S,x]$ means a 90° radiofrequency pulse applied to the S spins on an axis (x) of the doubly rotating frame; $\theta[S,y]$ means a $\theta°$ radiofrequency pulse applied to the S spins on an axis (y) orthogonal to the axis (x) of application of the $\pi/2[S,x]$ pulse; $\phi[I]$ means a $\phi°$ radiofrequency pulse applied to the I spins; acquire I means the detection of the radiofrequency signal emitted by the I spins; decouple S means the continuous application of radiofrequency energy to the S spins during the detection of the radiofrequency signal emitted by the I spins; $\pi[S]$ means a 180° radiofrequency pulse applied to the S spins; $\pi[I]$ means a 180° radiofrequency pulse applied to the I spins; wherein the order of pulses written $\pi/2[I]\pi[S]$ or $\pi[I]\pi[S]$ or $\theta[S,y]\pi[I]$ may be reversed or the pulses may be applied simultaneously; wherein any sequence written $1/2J-t/2-\pi[I]$ may be changed to $-t/2-\pi[I]-1/2J-$ or any sequence written $-1/2J-t/2-\pi[I]\pi[S]$ may be changed to $-t/2-\pi[I]\pi[S]-1/2J-$ and wherein the sequence written $-t/2-\pi[S]-1/2J-\pi[I]-t/2-$ may be changed to $-t/2-1/2J-\pi[I]\pi[S]-t/2-$ or $-t/2-\pi[I]\pi[S]-1/2J-t/2-$; and wherein the additional period t is incremented to provide the second time dimension for two dimensional nuclear magnetic resonance spectroscopy applications.

13. A method as claimed in claim 1, 3, 4, 5, 7, 9, 10, 11 or 12 wherein any of the pulse phases are phase cycled between consecutive scans.

14. A method as claimed in claim 1, 3, 4, 5, 7, 9, 10, 11 or 12 wherein the ordinary signal, as herein before defined, from the second type of nuclei (I) is suppressed by alternation of the phase of either of the pulses ($\pi/2$) applied to the first type of nuclei (S) and subtraction of the signal resulting from alternate scans, and/or wherein the ordinary signal from the second type of nuclei (I) is suppressed by presaturation of the magnetization of the second type of nuclei (I) by pre-irradiation of the second type of nuclei (I).

15. A method as claimed in claim 4, 5, 7, 9, 10, 11 or 12 wherein either the pulse $\pi/2[S,x]$ or the pulse $\theta[S,y]$ is phase alternated in conjunction with substraction of alternate scans and/or wherein the natural I-magnetization of the I nuclei is presaturated by pre-irradiation or by an initial sequence of the form $\pi/2[I]-1/2J-\pi[I]$ immediately prior to the main sequence.

16. A method as claimed in claim 1, 3, 4, 5, 7, 9, 10, 11 or 12 wherein composite pulses are used in substitution for any of the individual pulses to counteract pulse inhomogeneity or mis-setting of pulses.

17. A method as claimed in claim 1, 3, 4, 5, 7, 9, 10, 11 or 12 wherein any of the pulse phases are phase cycled between consecutive scans, and wherein composite pulses are used in substitution for any of the individual pulses, and wherein the ordinary signal from the second type of nuclei (I) is suppressed.

18. A method as claimed in claim 4 or 5 wherein the precession of the S spins and I spins because of chemical shift off-resonance is refocused for each period by the use of $\pi[I]\pi[S]$ pulses at the centre of each period, or by doubling the length of the first period and applying gated decoupling to the I spins for the first half of this period with a $\pi[S]$ pulse at the centre of this period, or by doubling the length of the last period and applying gated decoupling to the S spins for the last half of this period with a $\pi[I]$ pulse at the centre of this period wherein $\pi[S]$ means a 180° radiofrequency pulse applied to the S spins; $\pi[I]$ means a 180° radiofrequency pulse applied to the I spins; wherein the order of pulses written $\pi[I]\pi[S]$ may be reversed or the pulses may be applied simultaneously; wherein any of the pulse phases may be phase cycled between consecutive scans; wherein composite pulses may be used in substitution for any of the individual pulses; and wherein the ordinary signal from the second type of nuclei (I) may be suppressed.

19. A method as claimed in claim 7 wherein the precession of the S spins and I spins because of chemical shift off-resonance is refocused for each 1/2J period by the use of $\pi[I]\pi[S]$ pulses at the centre of each 1/2J period, or by doubling the length of the first 1/2J period and applying gated decoupling to the I spins for the first half of this period with a $\pi[S]$ pulse at the centre of this period, or by doubling the length of the last 1/2J period and applying gated decoupling to the S spins for the last half of this period with a $\pi[I]$ pulse at the centre of this period wherein $\pi[S]$ means a 180° radiofrequency pulse applied to the S spins; $\pi[I]$ means a 180° radiofrequency pulse applied to the I spins; and wherein the order of pulses written $\pi[I]\pi[S]$ may be reversed or the pulses may be applied simultaneously; wherein any of the pulse phases may be phase cycled between consecutive scans; wherein composite pulses may be used in substitution for any of the individual pulses; wherein the ordinary signal from the second type of nuclei (I) may be suppressed; and wherein any sequence written $-1/2J-t/2-\pi[I]$ may be changed to $-t/2-\pi[I]-1/2J-$ or any sequence written $-1/2J-t/2-\pi[I]\pi[S]$ may be changed to $-t/2-\pi[I]\pi[S]-1/2J-$ and wherein the sequence written $-t/2-\pi[S]-1/2J-\pi[I]-t/2-$ may be changed to $-t/2-1/2J-\pi[I]\pi[S]-t/2-$ or $-t/2-\pi[I]\pi[S]-1/2J-t/2-$.

20. A method as claimed in claim 7 wherein the precession of the S spins, because of chemical shift off-resonance, is refocused for the first two 1/2J periods and the precession of the I spins, because of chemical shift off-resonance, is refocused for the last two 1/2J periods, wherein the sequence written $-1/2J-t/2-\pi[I]-t/2-$, where the 1/2J period is the first such period, may be changed to $-t-1/2J-$ with gated decoupling applied to the I spins for the period t; or wherein the sequence written $-1/2J-t/2-\pi[I]\pi[S]-t/2-$, where the 1/2J period is the first such period, may be changed to $-t/2-\pi[S]-t/2-1/2J-$ with gated decoupling applied to the I spins for the first t/2 period, or wherein the sequence written $-1/2J-t/2-\pi[I]\pi[S]-t/2-$, where the 1/2J period is the last such period, may be changed to $-1/2J-t/2-\pi[I]-t/2-$ with gated decoupling applied to the S spins for the last t/2 period; wherein any of the pulse phases may be phase cycled between consecutive scans; wherein composite pulses may be used in substitution for any of the individual pulses; and wherein the ordinary signal from the second type of nuclei (I) may be suppressed.

21. A method as claimed in claim 1 wherein the phase of said third pulse is varied by an angle up to 180° relative to the phase of said first pulse.

* * * * *